US009369313B1

(12) United States Patent
Yu

(10) Patent No.: US 9,369,313 B1
(45) Date of Patent: Jun. 14, 2016

(54) PRE-AMPLIFIER AND A DECISION FEEDBACK EQUALIZER USING THE SAME FOR REDUCING TAP WEIGHT VARIATIONS

(71) Applicant: Po Shing Yu, Miaoli County (TW)

(72) Inventor: Po Shing Yu, Miaoli County (TW)

(73) Assignees: Global Unichip Corp., Hsinchu (TW); Taiwan Semiconductor Manufacturing Company Ltd., Hsinchu (TW)

(*) Notice: Subject to any disclaimer, the term of this patent is extended or adjusted under 35 U.S.C. 154(b) by 0 days.

(21) Appl. No.: 14/634,896

(22) Filed: Mar. 2, 2015

(51) Int. Cl.
H03H 7/30 (2006.01)
H04L 25/03 (2006.01)
H03F 1/02 (2006.01)
H03F 3/45 (2006.01)

(52) U.S. Cl.
CPC ........ *H04L 25/03057* (2013.01); *H03F 1/0205* (2013.01); *H03F 3/45179* (2013.01); *H03F 2203/45112* (2013.01)

(58) Field of Classification Search
CPC .......... H03F 3/45183; H03F 2200/432; H03F 2203/45136; H03F 2203/45244; H03F 3/45179; H03F 1/0205; H03F 2203/45112; H03F 2203/45051; H03F 1/301; H03F 1/4509; H03F 3/45; H03F 1/02; H03F 1/45098; H04L 25/0272; H03H 2210/023

USPC ................... 330/253, 261, 311; 375/297, 233; 327/266, 274, 280, 287
See application file for complete search history.

(56) References Cited

U.S. PATENT DOCUMENTS 6,480,065 B1* 11/2002 Herrera ............... H03F 3/45183
330/253
2012/0049946 A1* 3/2012 Boecker .................. H03F 1/301
327/559

* cited by examiner

*Primary Examiner* — Rahel Guarino
(74) *Attorney, Agent, or Firm* — Min-Lee Teng; Litron Patent & Trademark Office

(57) ABSTRACT

The present invention discloses pre-amplifier with a selectable threshold voltage in a decision feedback equalization circuit to reduce tap weight variation. A decision feedback equalization circuit includes a summer circuit and a pre-amplifier with an offset generator, wherein the pre-amplifier includes a pair of differential amplifiers and each biased by a respective current bias and each having first and second output nodes coupled to a supply voltage via a respective resistive element, R. The resistive elements may be implemented, for example, using diode-configured transistors, biased transistors, resistor, or any other active or passive circuitry for establishing a resistance. The inputs of first differential amplifier are coupled to the summer's output. The inputs of second differential amplifier are coupled to a reference voltage circuit that comprised of a resistive element and a respective current DAC (IDAC).

20 Claims, 7 Drawing Sheets

PRE-AMPLIFIER AND A DECISION FEEDBACK EQUALIZER USING THE SAME FOR REDUCING TAP WEIGHT VARIATIONS

BACKGROUND OF THE INVENTION

1. Field of the Invention

The present invention relates generally to a circuit design, and more particularly to an equalizer circuit design.

2. Description of the Prior Art

Electrical pulses transmitted on a band-limited signaling path disperse in time as they travel from source to destination. In systems in which data is transmitted as a sequence of level-encoded electrical pulses, such time-domain dispersion results in a blending of neighboring pulses; an effect known as dispersion-type inter-symbol interference (ISI). Dispersion-type ISI becomes more pronounced at faster signaling rates, ultimately degrading the signal quality to the point at which distinctions between originally transmitted signal levels may be lost.

FIG. 1 illustrates a block diagram for RX Decision Feedback Equalization (DFE). DFE is a non-linear equalizer. The slicer makes a symbol decision, i.e. quantizes input, and ISI is then directly subtracted from the incoming signal via a feedback FIR filter. Filter tap coefficients can be adaptively tuned without any back-channel.

FIG. 2 is a conventional block diagram of a loop-unrolled DFE in which two parallel paths are used to pre-compute the resultant product of the first tap of the FBE for both possible outcomes (i.e., a logical one or a logical zero) of the decision device. The first parallel path of loop-unrolling device, which includes the slicer, presupposes that the next decided value output from decision device, corresponding to the bit received prior to the bit being currently processed in the incoming serial data stream, will be a logical one value. The slicer receives the output of a combiner to combine the tap weights, H2, H3, H4, H5, and a threshold level H1. However, the second parallel path presupposes that the next decided value output from decision device, corresponding to the bit received prior to the bit being currently processed in the incoming serial data stream, will be a logical one value. The slicer receives the output of a combiner to combine the tap weights, H2, H3, H4, H5, and a threshold level –H1.

Once the decision device determines the next decided symbol value at its output; the decided symbol value can be used as the select input to multiplexer. Thus, the output of the parallel path in the loop-unrolling device that corresponds to the actual symbol value output by decision device is selected. Loop-unrolling device thereby eliminates the critical path containing the next decided symbol value.

FIG. 3 illustrates a conventional comparator with a DAC-selectable threshold in US patent publication No. 20120213267. The comparator 400 includes a preamplifier 401 and a sampling circuit 425. The preamplifier 401 includes a pair of differential amplifiers 402 and 403 each biased by a respective current DAC (IDAC) 411 and 413, and each has first and second output nodes 418 and 419 coupled to a supply voltage via a respective resistive element, R. The resistive elements may be implemented, for example, using diode-configured transistors, biased transistors, resistors, or any other active or passive circuitry for establishing a resistance. Transistors 405 and 404 within differential amplifier 402 have widths W1 and W2, respectively, with W1 being greater than W2. A differential input signal composed of signal components D and /D is coupled to each of the differential amplifiers 402, 403 such that D is coupled to transistors 404 and 408 and /D is coupled to transistors 405 and 407. Thus, if D is greater than /D, transistors 404 and 408 will collectively sink more current than transistors 405 and 407, thereby causing the voltage on output node 418 to be pulled down (i.e., via the resistive element, R, coupled to the output node 418) more than the voltage on output node 419.

The conventional threshold voltage design needs to track with the parameters of the transistors such as Vgs-Vth (voltage between the gate and the source voltage-threshold voltage of the MOSFET transistor) or the dimension of the channel in the MOSFET transistors.

Therefore, what is needed is a new way to design a threshold voltage generator in a DFE circuit to track with less parameters.

SUMMARY OF THE INVENTION

One objective of present invention is to provide a pre-amplifier with a selectable threshold voltage for sampling a first pair of differential signals.

One objective of present invention is to provide a decision feedback equalization circuit to reduce tap weight variation.

The present invention discloses a decision feedback equalization circuit includes a summer circuit and a pre-amplifier with an offset generator, wherein the pre-amplifier includes a pair of differential amplifiers, each biased by a respective current bias and each having first and second output nodes coupled to a supply voltage via a respective resistive element, R. The inputs of the first differential amplifier are coupled to the summer's output. The inputs of the second differential amplifier are coupled to a reference voltage circuit that comprises of a resistive element and a respective current DAC (IDAC).

One embodiment of present invention is to provide a pre-amplifier circuit, the pre-amplifier circuit comprising: a first differential amplifier having a first output node and a second output node, the first differential amplifier comprising a first differential transistor pair configured to provide a first differential current signal at the first output node and the second output node in accordance with a first pair of differential signals coupled to two control terminals of the first differential transistor pair, respectively, wherein the first differential transistor pair is biased by a first current source; and a second differential amplifier having a third output node and a fourth output node, the second differential amplifier comprising a second differential transistor pair configured to provide a second differential current signal at the third output node and the fourth output node in accordance with a voltage difference between two control terminals of the second differential transistor pair, wherein the second differential transistor pair is biased by a second current source, and at least one adjustable reference voltage circuit is coupled to at least one of the two control terminals of the second differential transistor pair to generate the voltage difference between the two control terminals of the second differential transistor pair; wherein the first output node and the third output node are coupled at a fifth output node and the second output node and the fourth output node are coupled at a sixth output node, wherein the fifth output node is coupled to a first supply voltage via a first resistive element and the sixth output node is coupled to a second supply voltage via a second resistive element.

In one embodiment, the transconductance of the first differential amplifier and the transconductance of the second differential amplifier are substantially equal.

In one embodiment, the at least one reference voltage circuit comprises a first reference voltage circuit and a second reference voltage circuit, wherein the first reference voltage circuit is coupled to a first control terminal of the two control terminals of the second differential transistor pair and the second reference voltage circuit is coupled to a second control terminal of the two control terminals of the second differential transistor pair.

In one embodiment, the first reference voltage circuit comprises a third resistive element and a first programmable current DAC; and the second reference voltage circuit comprises a fourth resistive element and a second programmable current DAC, wherein the first control terminal of the second differential transistor pair is coupled to a third supply voltage through the third resistive element and a ground reference voltage through the first programmable current DAC; and the second control terminal of the second differential transistor pair is coupled to a fourth supply voltage through the fourth resistive element and the ground reference voltage through the second programmable current DAC.

In one embodiment, each of the first resistive element and the second resistive element is a resistor and each of the third resistive element and the fourth resistive element is a resistor.

In one embodiment, a decision feedback equalization circuit is disclosed, wherein the decision feedback equalization circuit comprises: a summer circuit coupled to a first pair of differential signals, for adding one or more equalization signals to the first pair of differential signals to generate a second pair of differential signals; a first differential amplifier having a first output node and a second output node, the first differential amplifier comprising a first differential transistor pair configured to provide a first differential current signal at the first output node and the second output node in accordance with the second pair of differential signals coupled to two control terminals of the first differential transistor pair, respectively, wherein the first differential transistor pair is biased by a first current source; and a second differential amplifier having a third output node and a fourth output node, the second differential amplifier comprising a second differential transistor pair configured to provide a second differential current signal at the third output node and the fourth output node in accordance with a voltage difference between two control terminals of the second differential transistor pair, wherein the second differential transistor pair is biased by a second current source, and at least one adjustable reference voltage circuit is coupled to at least one of the two control terminals of the second differential transistor pair to generate the voltage difference between the two control terminals of the second differential transistor pair; wherein the first output node and the third output node are coupled at a fifth output node and the second output node and the fourth output node are coupled at a sixth output node, wherein the fifth output node is coupled to a first supply voltage via a first resistive element and the sixth output node is coupled to a second supply voltage via a second resistive element.

In one embodiment, the transconductance of the first differential amplifier and the transconductance of the second differential amplifier are substantially equal.

In one embodiment, the at least one reference voltage circuit comprises a first reference voltage circuit and a second reference voltage circuit, wherein the first reference voltage circuit is coupled to a first control terminal of the second differential transistor pair, and the second reference voltage circuit is coupled to a second control terminal of the second differential transistor pair.

In one embodiment, the first reference voltage circuit comprises a third resistive element and a first programmable current DAC; and the second reference voltage circuit comprises a fourth resistive element and a second programmable current DAC, wherein the first control terminal of the second differential transistor pair is coupled to a third supply voltage through the third resistive element and a ground reference voltage through the first programmable current DAC; and the second control terminal of the second differential transistor pair is coupled to a fourth supply voltage through the fourth resistive element and the ground reference voltage through the second programmable current DAC.

In one embodiment, each of the first resistive element and the second resistive element is a resistor.

In one embodiment, each of the third resistive element and the fourth resistive element is a resistor.

In one embodiment, the second differential transistor pair is formed by a first MOSFET transistor and a second MOSFET transistor, wherein the first control terminal and the second control terminal of the second differential transistor pair are two gate terminals of the first MOSFET transistor and the second MOSFET transistor, respectively.

In one embodiment, the summer circuit comprises: a third differential transistor pair configured to provide a third pair of differential current signals in accordance with the first pair of differential signals, wherein the third differential transistor pair is biased by a current source; and at least one fourth differential transistor pair, wherein each of the at least one fourth differential transistor pair is biased by a programmable current DAC for adding a corresponding equalization signal to the first pair of differential signals to generate the second pair of differential signals.

In one embodiment, the fifth output node and the sixth output node form a pair of output signals coupled to a sampling circuit.

In one embodiment, the third differential transistor pair and each of the at least one fourth differential transistor pair are respectively formed by a pair of MOSFET transistors.

BRIEF DESCRIPTION OF DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF EMBODIMENT

Figure 1:
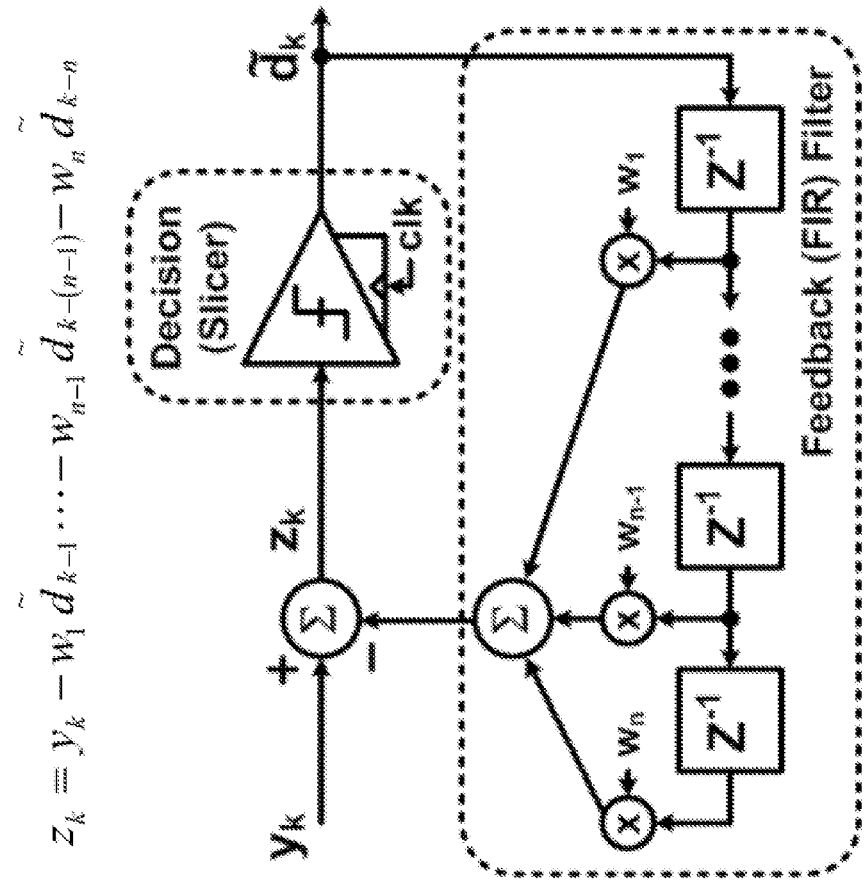
FIG. 1 illustrates a conventional block diagram for a Decision Feedback Equalization.
Figure 2:
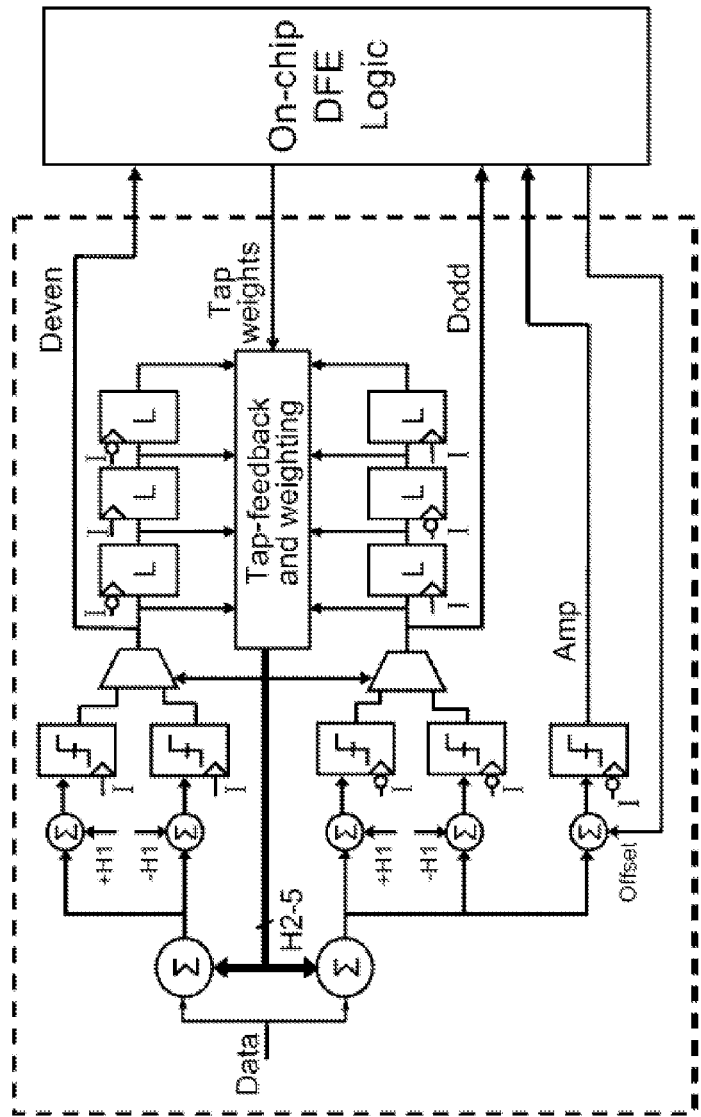
FIG. 2 is a conventional implementation of a loop-unrolled DFE with a summer block.
Figure 3:
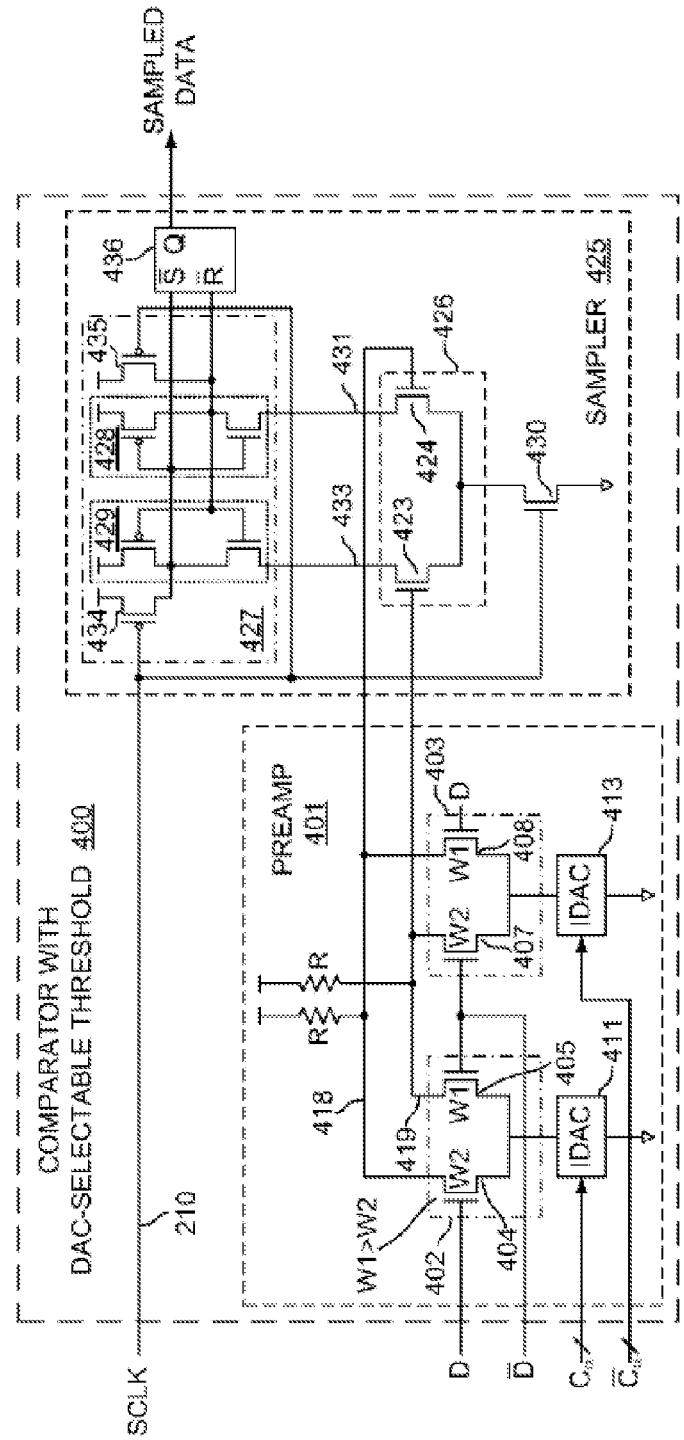
FIG. 3 illustrates a conventional comparator with DAC-selectable threshold.

The detailed explanation of the present invention is described as following. The described preferred embodiments are presented for purposes of illustrations and description, and they are not intended to limit the scope of the present invention.

FIG. 4 illustrates a comparator with DAC-selectable threshold in accordance with one embodiment of this invention. The comparator 1000 includes a pre-amplifier circuit 1100 and a threshold voltage generator design 1200. The pre-amplifier 1100 is used for adding a threshold voltage to a first pair of input differential signals 1001, 1002 having a positive signal node VIP 1001 and a negative signal node VIN 1002, wherein the pre-amplifier circuit 1100 comprises a first differential amplifier having a first differential transistor pair 1103, 1104 coupled at the source terminals of the transistor pair 1103, 1104 and a second differential amplifier having a second differential transistor pair 1111, 1112 coupled at the source terminals of the transistor pair 1111, 1112. The first differential amplifier is biased by a first current source 1105 at the coupled source terminals of the first differential transistor pair 1103, 1104; and the second differential amplifier is biased by a second current source 1110 at the coupled source terminals of the second differential transistor pair 1111, 1112. The current source can be implemented in many different ways and the goal of the current source is to maintain a stable bias voltage at the source terminals of the first differential transistor pair 1103, 1104 and the second differential transistor pair 1111, 1112 independent of the magnitude of the current flowing through the current source, so that the current flowing from the drain terminals to the source terminals of the first differential transistor pair 1103, 1104 and the second differential transistor pair 1111, 1112 can be respectively determined by the voltage difference of the control terminals and the transconductance (gm) of the corresponding differential transistor pair. For a NMOS transistor pair, the current source can couple to a negative power supply so that the source terminals of the NMOS transistor pair can be maintained at a bias voltage such that voltage between the gate and the source voltage is large than the threshold voltage of the NMOS transistor.

The first differential amplifier is configured to provide a first differential current signal at the first output node 1120 and the second output node 1121 of the first differential amplifier in accordance with the first pair of differential signals 1001, 1002. The first differential transistor pair comprises a first MOSFET transistor 1103 and a second MOSFET transistor 1104. The first MOSFET transistor 1103 has a first control terminal, which is the gate of the first MOSFET transistor 1103, coupled to a positive signal node VIP 1001; and the second MOSFET transistor 1104 has a second control terminal, which is the gate of the second MOSFET transistor 1104, coupled to the negative signal node VIN 1002. The second differential amplifier formed by the second differential transistor pair 1111, 1112 has a third output node 1130 and a fourth output node 1131, wherein second differential amplifier is configured to provide a second differential current signal at the third output node 1130 and the fourth output node 1131 in accordance with at least one reference voltage circuit coupled to the control terminals of the second differential amplifier.

In one embodiment, at least one reference voltage circuit includes first reference voltage circuit and a second reference voltage circuit, wherein the first reference voltage circuit comprises a third resistive element 1106 and a first programmable current DAC 1108; and the second reference voltage circuit comprises a fourth resistive element 1107 and a second programmable current DAC 1109.

In one embodiment, the second differential transistor pair comprises a third MOSFET transistor 1111 and a fourth MOSFET transistor 1112. The third MOSFET transistor 1111 has a third control terminal, which is the gate of the third MOSFET transistor, coupled to the first reference voltage circuit at the junction of the third resistive element 1106 and the first programmable current DAC 1108; the fourth MOSFET transistor 1112 has a fourth control terminal, which is the gate of the fourth MOSFET transistor, coupled to the second reference voltage circuit at the junction of the fourth resistive element 1107 and the second programmable current DAC 1109. Please note that third resistive element 1106 and fourth MOSFET transistor 1112 can couple to a positive power supply; and the first programmable current DAC 1108 and the second programmable current DAC 1109 can couple to a negative power supply, so that a maximum swing can be achieved at the control terminals of the second differential transistor pair 1111, 1112.

In one embodiment, each of the first programmable current DAC 1108 and the second reference voltage circuit 1109 is controlled by a first set of digital control words $C_h$ and a second set of digital control words $/C_h$, respectively. Thus, by setting $C_h$ and $/C_h$, a desired threshold voltage H1 can be set accordingly. In a loop-unrolling design, a counterpart threshold voltage generator having −H1 threshold can be provided by switching the $C_h$ and $/C_h$ inputs to the current DAC 1108 and current DAC 1109.

Figure 4A:
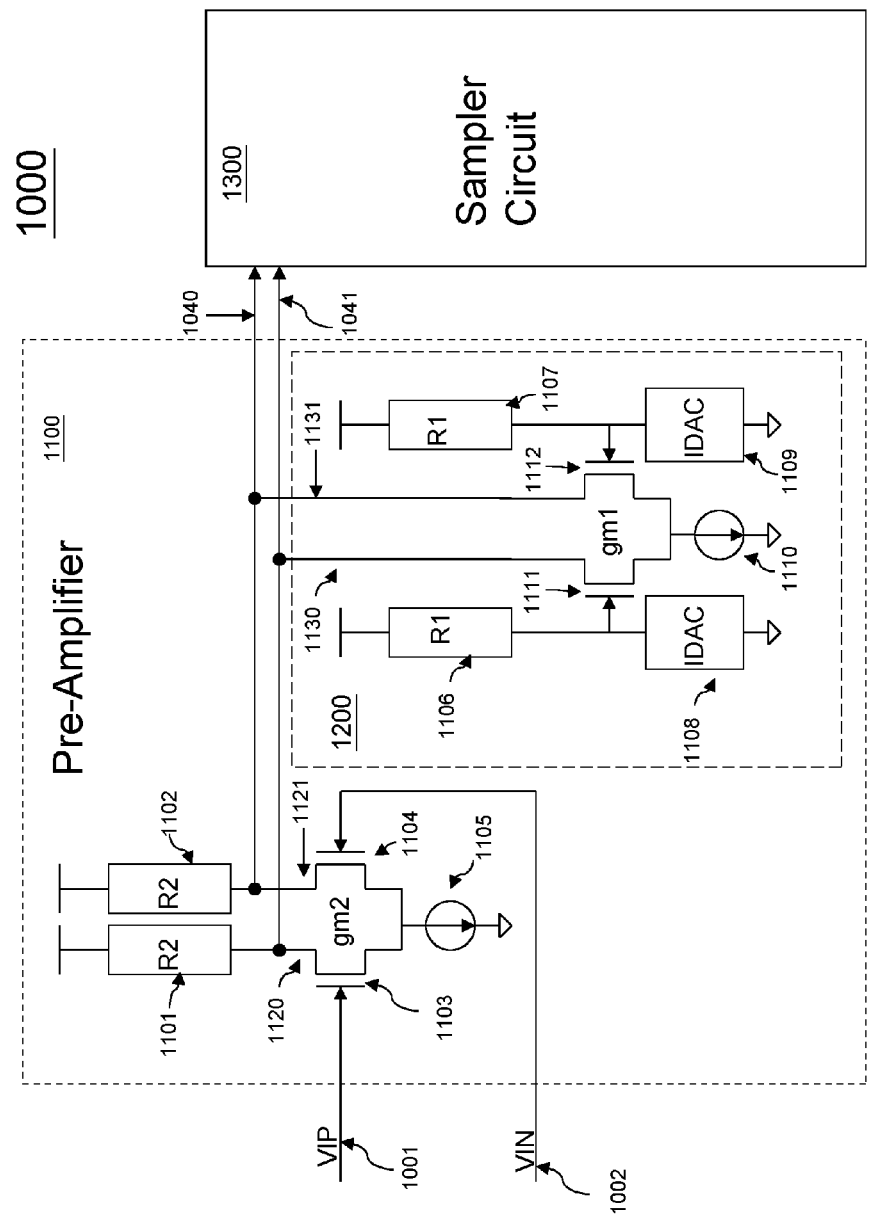
FIG. 4A-4C illustrates a comparator with DAC-selectable threshold in accordance with one embodiment of this invention.
Figure 4B:
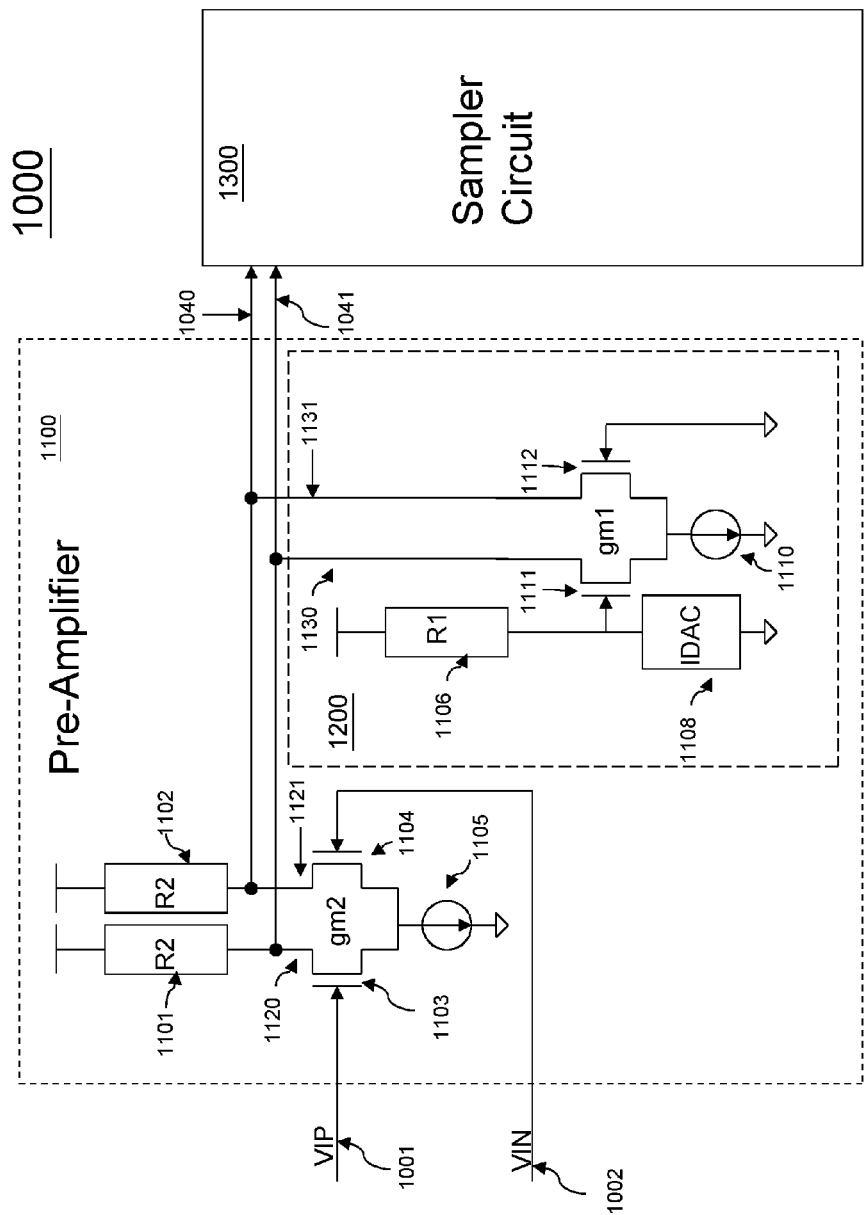
Figure 4C:
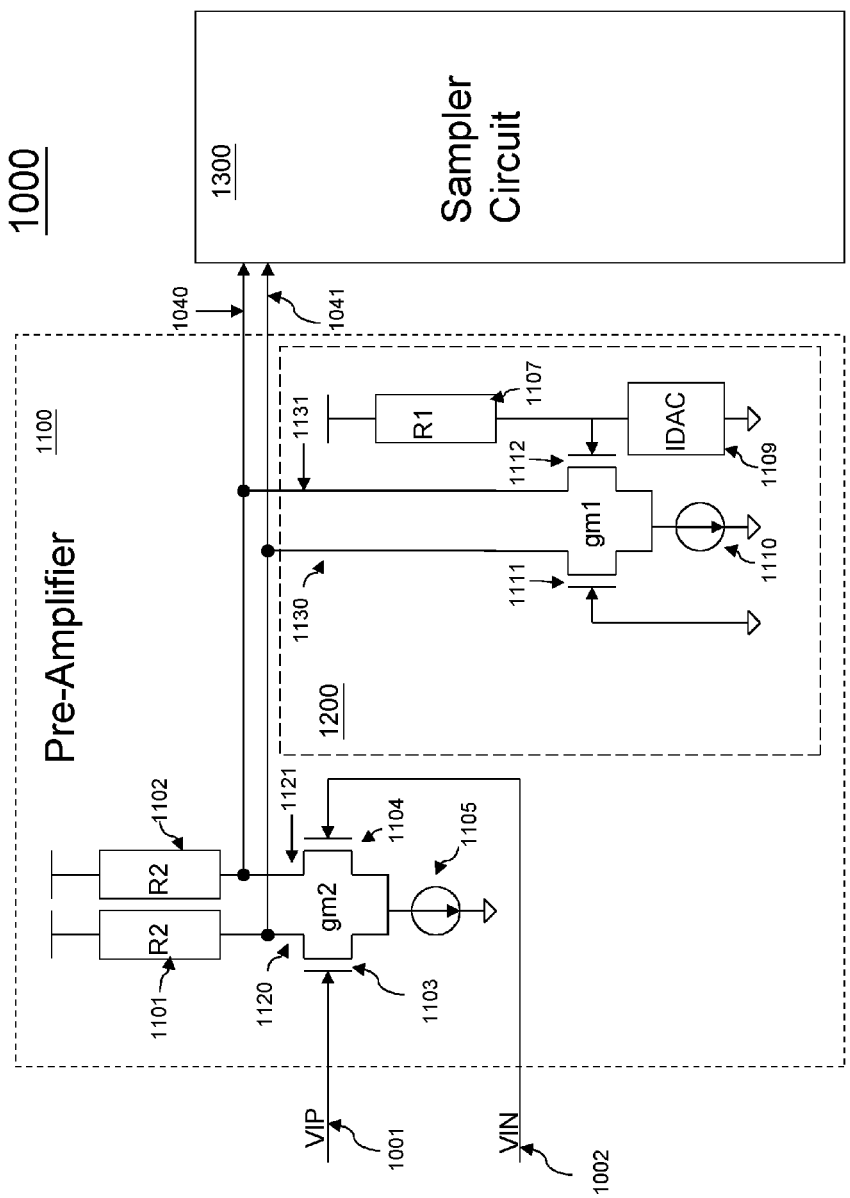

In one embodiment, as shown in FIG. 4B, only the first reference voltage circuit composed of the third resistive element 1106 and the first programmable current DAC 1108 is used to generate the threshold voltage H1. In one embodiment, as shown in FIG. 4C, only the second reference voltage circuit composed of the fourth resistive element 1107 and the second programmable current DAC 1109 is used to generate the threshold voltage H1. Please note that the voltage difference between the control terminals of the second differential transistor pair transistor 1111, 1112 can be controlled in many ways, for example, an adjustable voltage DAC can be used to generate the voltage difference between the control terminals of the second differential transistor pair transistor 1111, 1112.

The first output node 1120 is coupled to the third output node 1130 at an output node 1040 and the second output node 1121 is coupled to the fourth output node 1131 at an output node 1041, wherein the output node 1040 and the output node 1041 form a differential output signals to a sampling circuit 1300. A first voltage supply is coupled to the first output node 1120 and the third output node 1130 via a resistive element 1101; and a second voltage supply is coupled to the second output node 1121 and the fourth output node 1131 via a second resistive element 1102. The resistive element 1101, 1102 can be implemented, for example, using diode-configured transistors, biased transistors, resistors, or any other active or passive circuitry for establishing a resistance. The resistive element 1106, 1107 can be implemented, for example, using diode-configured transistors, biased transistors, resistors, or any other active or passive circuitry for establishing a resistance. In this embodiment, each of the resistive element 1101 and the resistive element 1102 is a resistor R2, and each of the third resistive element 1106 and the fourth resistive element 1107 is a resistor R1.

From the circuit in FIG. 4A, a threshold voltage H1 is Idac*R1*gm1/gm2, wherein Idac is the total differential current between the control or gate terminals of the second differential transistor pair 1111, 1112, which is generated by the first programmable current DAC 1108 and the second programmable current DAC 1109; gm2 is the transconductance of the first differential amplifier and gm1 is the transconductance of the second differential amplifier. If the transconductance of the second differential amplifier and the transconductance of the first differential amplifier have a fixed ratio M, then H1 is equal to Idac*R1*M. In one embodiment, M is equal to 1 and H1 is equal to Idac*R1, which means H1 will not depend on the transconductance of the transconductance of the second differential amplifier, so that H1 will track with the Idac and the resistive elements 1106, 1107, which can have the same resistance R1.

Figure 5:
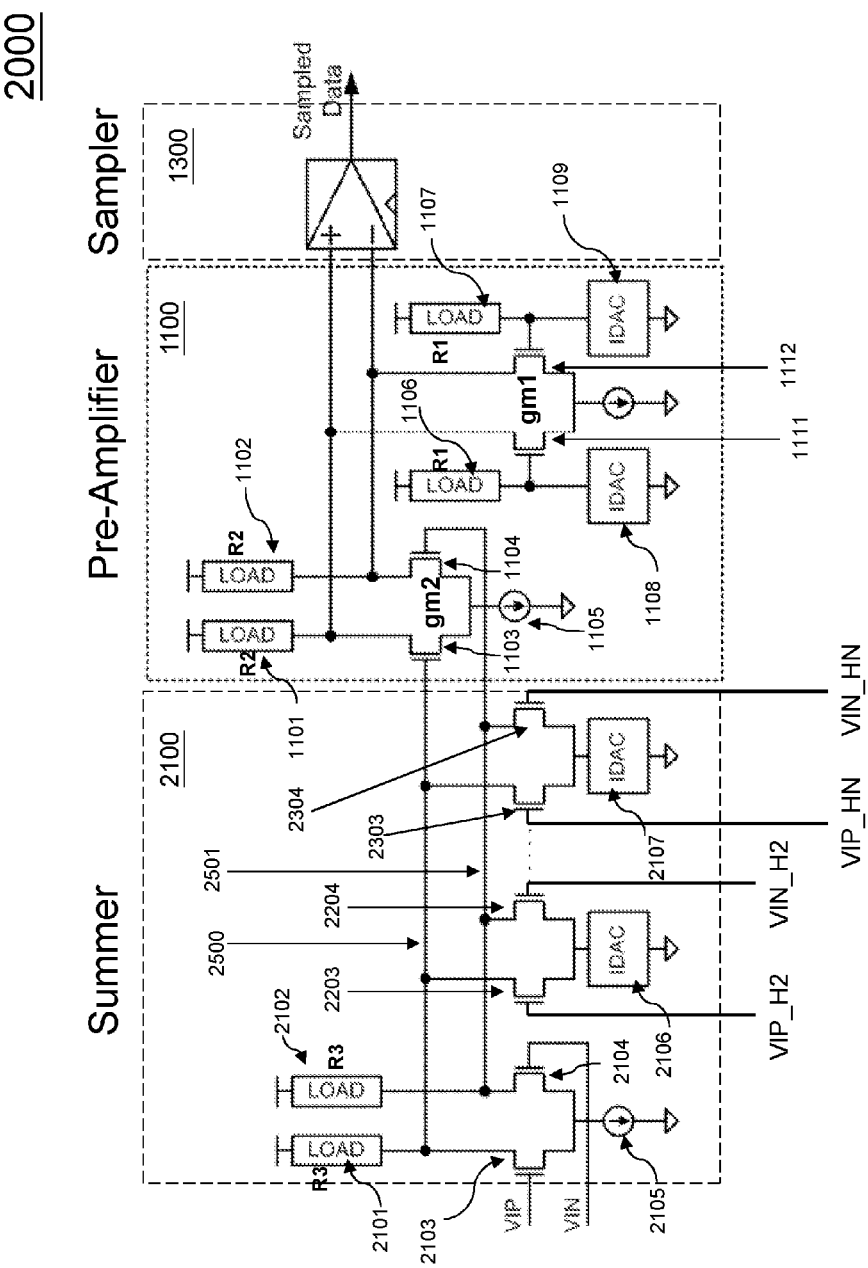
FIG. 5 illustrates a DFE circuit design in accordance with one embodiment of this invention.

FIG. 5 illustrates a block diagram of DFE design 2000 with the pre-amplifier circuit 1200 of FIG. 4A in accordance with one embodiment of this invention. As shown in FIG. 5, the differential transistor pair 2103, 2104 is driven by a differential input signal VIP, VIN and provides output currents through load resistors R3 2101, 2102. As a result, a differential output signal is generated at output nodes 2110, 2111. A current source 2105 provides a tail current for the differential transistor pair 2103, 2104. Please note that the current source can be implemented in many different ways and the goal of the current source is to maintain a stable bias voltage at the source terminals of the differential transistor pair 2103, 2104 independent of the magnitude of the current flowing through the current source, so that the current flowing from the drain terminals to the source terminals of the first differential transistor pair 2103, 2104 can be determined by the input voltage applied at the gate terminals and the transconductance (gm) of the differential transistor pair 2103, 2104.

A second differential transistor pair 2203, 2204 and an associated digital to analog converter 2106 adds tap weight H2 to the output signal. That is, when VIP_H2 is positive relative to VIN_H2, current is added to the OUTP node 2500 through the load resistors R3 2101; otherwise, current is added to the OUTN node 2501 through the load resistors R3 2102, so that the voltage between the OUTP node 2500 and the OUTN node 2501 can be adjusted by the tap weight H2.

There can be N number of tap weights in the summer circuit, and each of the tap weight has a corresponding differential transistor pair and an associated digital to analog converter. As shown in FIG. 5, the Nth differential transistor pair 2303, 2304 and an associated digital to analog converter 2107 adds HN to the output signal. The pre-amplifier 1100 adds a threshold voltage to the output of the summer and outputs the added result to the sampler circuit 1300. The description of the pre-amplifier 1100 is the same as the descriptions for FIG. 4A-4C; therefore, it is not described further herein.

From the circuit in FIG. 5 and the description of FIG. 4A, a threshold voltage H1 generated by the threshold voltage generator 1200 is equal to Idac*R1*gm1/gm2, wherein Idac is a total current generated by the first programmable current DAC 1108 and the second programmable current DAC 1109 at the control terminals of the of the second differential amplifier, gm2 is the transconductance of the differential transistor pair 1103, 1104, and gm1 is the transconductance of the differential transistor pair 1111, 1112. If gm1 and gm2 have a substantially fixed ratio M, then H1 is equal to Idac*R1*M. In one embodiment, M is equal to 1 and H1 is equal to Idac*R1, which means that H1 does not depend on the transconductance of the second differential amplifier, and H1 will track with the Idac and the resistance R1 of the resistive elements 1106, 1107.

In summary, each of the H2, H3 . . . and HN in the summer circuit tracks with R3, and H1 tracks with the resistance R1. As a result, H1, H2, and HN in the circuit in FIG. 5 can all track with resistor values. Since the resistor values can be made with high precision, the DFE circuit of the present invention can reduce tap weight variations and achieve higher accuracy compared with conventional DFE circuit.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A pre-amplifier circuit, comprising:
   a first differential amplifier having a first output node and a second output node, the first differential amplifier comprising a first differential transistor pair configured to provide a first differential current signal at the first output node and the second output node in accordance with a first pair of differential signals coupled to two control terminals of the first differential transistor pair, respectively, wherein the first differential transistor pair is biased by a first current source; and
   a second differential amplifier having a third output node and a fourth output node, the second differential amplifier comprising a second differential transistor pair configured to provide a second differential current signal at the third output node and the fourth output node in accordance with a voltage difference between two control terminals of the second differential transistor pair, wherein the second differential transistor pair is biased by a second current source, and at least one adjustable reference voltage circuit is coupled to at least one of the two control terminals of the second differential transistor pair to generate the voltage difference between the two control terminals of the second differential transistor pair;
   wherein the first output node and the third output node are coupled at a fifth output node and the second output node and the fourth output node are coupled at a sixth output node, wherein the fifth output node is coupled to a first supply voltage via a first resistive element and the sixth output node is coupled to a second supply voltage via a second resistive element.

2. The pre-amplifier circuit of claim 1, wherein a first transconductance of the first differential amplifier and a second transconductance of the second differential amplifier are substantially equal.

3. The pre-amplifier circuit of claim 1, wherein the at least one reference voltage circuit comprises a first reference voltage circuit and a second reference voltage circuit, wherein the first reference voltage circuit is coupled to a first control terminal of the two control terminals of the second differential transistor pair and the second reference voltage circuit is coupled to a second control terminal of the two control terminals of the second differential transistor pair.

4. The pre-amplifier circuit of claim 3, wherein the first reference voltage circuit comprises a third resistive element and a first programmable current digital-to-analog converter (DAC); and the second reference voltage circuit comprises a fourth resistive element and a second programmable current DAC, wherein the first control terminal of the second differential transistor pair is coupled to a third supply voltage through the third resistive element and a ground reference voltage through the first programmable current DAC; and the second control terminal of the second differential transistor pair is coupled to a fourth supply voltage through the fourth resistive element and the ground reference voltage through the second programmable current DAC.

5. The pre-amplifier circuit of claim 1, wherein each of the first resistive element and the second resistive element is a resistor.

6. The pre-amplifier circuit of claim 1, wherein the fifth output node and the sixth output node form a pair of output signals coupled to a sampling circuit.

7. The pre-amplifier circuit of claim 4 wherein the first differential transistor pair is formed by a first MOSFET transistor and a second MOSFET transistor.

8. The pre-amplifier circuit of claim 4, wherein each of the third resistive element and the fourth resistive element is a resistor.

9. The pre-amplifier circuit of claim 7, wherein the second differential transistor pair is formed by a third MOSFET transistor and a fourth MOSFET transistor.

10. The pre-amplifier circuit of claim 9, wherein the first pair of differential signals is coupled to a summer circuit, wherein a second pair of differential signals outputted from the summer circuit is connected to two gate terminals of the first MOSFET transistor and the second MOSFET transistor, respectively.

11. A decision feedback equalization circuit, comprising:
a summer circuit coupled to a first pair of differential signals, for adding one or more equalization signals to the first pair of differential signals to generate a second pair of differential signals;
a first differential amplifier having a first output node and a second output node, the first differential amplifier comprising a first differential transistor pair configured to provide a first differential current signal at the first output node and the second output node in accordance with the second pair of differential signals coupled to two control terminals of the first differential transistor pair, respectively, wherein the first differential transistor pair is biased by a first current source; and
a second differential amplifier having a third output node and a fourth output node, the second differential amplifier comprising a second differential transistor pair configured to provide a second differential current signal at the third output node and the fourth output node in accordance with a voltage difference between two control terminals of the second differential transistor pair, wherein the second differential transistor pair is biased by a second current source, and at least one adjustable reference voltage circuit is coupled to at least one of the two control terminals of the second differential transistor pair to generate the voltage difference between the two control terminals of the second differential transistor pair;
wherein the first output node and the third output node are coupled at a fifth output node and the second output node and the fourth output node are coupled at a sixth output node, wherein the fifth output node is coupled to a first supply voltage via a first resistive element and the sixth output node is coupled to a second supply voltage via a second resistive element.

12. The decision feedback equalization circuit of claim 11, wherein a first transconductance of the first differential amplifier and a second transconductance of the second differential amplifier are substantially equal.

13. The decision feedback equalization circuit of claim 11, wherein the at least one reference voltage circuit comprises a first reference voltage circuit and a second reference voltage circuit, wherein the first reference voltage circuit is coupled to a first control terminal of the second differential transistor pair, and the second reference voltage circuit is coupled to a second control terminal of the second differential transistor pair.

14. The decision feedback equalization circuit of claim 11, wherein the first reference voltage circuit comprises a third resistive element and a first programmable current digital-to-analog converter (DAC); and the second reference voltage circuit comprises a fourth resistive element and a second programmable current DAC, wherein the first control terminal of the second differential transistor pair is coupled to a third supply voltage through the third resistive element and a ground reference voltage through the first programmable current DAC; and the second control terminal of the second differential transistor pair is coupled to a fourth supply voltage through the fourth resistive element and the ground reference voltage through the second programmable current DAC.

15. The decision feedback equalization circuit of claim 11, wherein each of the first resistive element and the second resistive element is a resistor.

16. The decision feedback equalization circuit of claim 14, wherein each of the third resistive element and the fourth resistive element is a resistor.

17. The decision feedback equalization circuit of claim 13, wherein the second differential transistor pair is formed by a first MOSFET transistor and a second MOSFET transistor, wherein the first control terminal and the second control terminal of the second differential transistor pair are two gate terminals of the first MOSFET transistor and the second MOSFET transistor, respectively.

18. The decision feedback equalization circuit of claim 11, wherein the summer circuit comprises:
a third differential transistor pair configured to provide a third pair of differential current signals in accordance with the first pair of differential signals, wherein the third differential transistor pair is biased by a third current source; and
at least one fourth differential transistor pair, wherein each of the at least one fourth differential transistor pair is biased by a programmable current DAC for adding a corresponding equalization signal to the first pair of differential signals.

19. The decision feedback equalization circuit of claim 18, further comprising a sampling circuit, wherein the fifth output node and the sixth output node form a pair of output signals inputted to the sampling circuit.

20. The decision feedback equalization circuit of claim 18, wherein the third differential transistor pair and each of the at least one fourth differential transistor pair are respectively formed by a pair of MOSFET transistors.

* * * * *